United States Patent

Shiga et al.

(10) Patent No.: US 9,043,679 B2
(45) Date of Patent: May 26, 2015

(54) MEMORY DEVICE

(71) Applicants: Hitoshi Shiga, Kawasaki (JP); Hidetaka Tsuji, Yokohama (JP)

(72) Inventors: Hitoshi Shiga, Kawasaki (JP); Hidetaka Tsuji, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 103 days.

(21) Appl. No.: 13/719,479

(22) Filed: Dec. 19, 2012

(65) Prior Publication Data

US 2014/0006906 A1 Jan. 2, 2014

Related U.S. Application Data

(60) Provisional application No. 61/667,216, filed on Jul. 2, 2012.

(51) Int. Cl.
*G11C 29/00* (2006.01)
*G06F 11/10* (2006.01)
*G11C 29/04* (2006.01)

(52) U.S. Cl.
CPC ........ *G06F 11/1008* (2013.01); *G06F 11/1072* (2013.01); *G11C 2029/0411* (2013.01)

(58) Field of Classification Search
CPC ............ G06F 11/1076; G06F 11/1008; G06F 11/106; H05K 999/99; G11C 2029/0411
USPC .......................................................... 714/764
See application file for complete search history.

(56) References Cited

U.S. PATENT DOCUMENTS

| 7,394,691 | B2 | 7/2008 | Shibata et al. | |
|---|---|---|---|---|
| 7,522,452 | B2 | 4/2009 | Shiga | |
| 2008/0123410 | A1* | 5/2008 | Shirakawa et al. | 365/185.03 |
| 2010/0302847 | A1 | 12/2010 | Komai et al. | |
| 2011/0032760 | A1 | 2/2011 | Takagiwa | |
| 2011/0141817 | A1 | 6/2011 | Takagiwa | |
| 2012/0017138 | A1* | 1/2012 | Erez et al. | 714/773 |
| 2012/0159281 | A1* | 6/2012 | Shalvi et al. | 714/755 |
| 2012/0304039 | A1* | 11/2012 | Peterson et al. | 714/773 |
| 2013/0058164 | A1* | 3/2013 | Moschiano et al. | 365/185.09 |
| 2014/0164870 | A1* | 6/2014 | Sun et al. | 714/764 |

* cited by examiner

*Primary Examiner* — Albert Decady
*Assistant Examiner* — Enam Ahmed
(74) *Attorney, Agent, or Firm* — Oblon, McClelland, Maier & Neustadt, L.L.P.

(57) ABSTRACT

A memory device includes a memory chip that stores data, and an external controller that controls the memory chip. The memory chip includes multiple memory cells configured to store data of two or more bits; and an internal controller that executes a program operation for page data including a lower and an upper page program operation, and executes a read operation for page data including a lower and an upper page read operation. The external controller includes an error correction unit that performs error correction encoding on data to be programmed into the memory cell array and performs error correction decoding on data. The internal controller outputs the read page data from the memory cell array to the external controller, regardless of whether the upper page program operation is complete or not, in the upper page read operation.

20 Claims, 13 Drawing Sheets

MEMORY DEVICE

CROSS-REFERENCE TO RELATED APPLICATIONS

This application is based upon and claims the benefit of U.S. Provisional Patent Application No. 61/667,216, filed on Jul. 2, 2012, the entire contents of which are incorporated herein by reference.

FIELD

An embodiment herein disclosed relates to a memory device.

BACKGROUND

Description of the Related Art

Along with the popularization of information processors such as mobile terminal devices, there is an increasing demand for increasing a storage capacity and improving the integration degree of memory devices. Accordingly, memory devices configured to store data of two or more bits in a single memory cell have also been developed. For example, in a flash memory that accumulates electric charge in an electric charge accumulation layer to control a threshold value of each memory cell, the amount of electric charge accumulated in the electric charge accumulation layer is finely controlled. The fine control enables formation of four or more threshold value distributions, thereby storing data of two or more bits.

Along with the demand for further improvement in storage capacity, the miniaturization of memory devices is in progress and the influence between neighboring memory cells is increasing. Accordingly, techniques for improving the reliability, such as an error correction technique, have become important. However, various flags for use in various controls within a memory chip are not read out of the memory chip. This makes it difficult to compensate for the flags by the error correction technique or the like. Therefore, it becomes more important to take any countermeasure against deterioration in the reliability.

DETAILED DESCRIPTION

A memory device according to an embodiment includes a memory chip that stores data and an external controller that controls the memory chip. The memory chip includes: a plurality of memory cells configured to store data of two or more bits, the memory cells constituting a page as a program unit; and an internal controller that executes a program operation for page data including a lower page program operation and an upper page program operation for the same page of the memory cell array, and executes a read operation for page data including a lower page read operation and an upper page read operation from the memory cell array. The external controller includes an error correction unit that performs error correction encoding on data to be programmed into the memory cell array, and performs error correction decoding on data read from the memory cell array. The internal controller outputs the page data read from the memory cell array to the external controller, regardless of whether the upper page program operation is complete or not, in the upper page read operation.

First Embodiment

Figure 1:
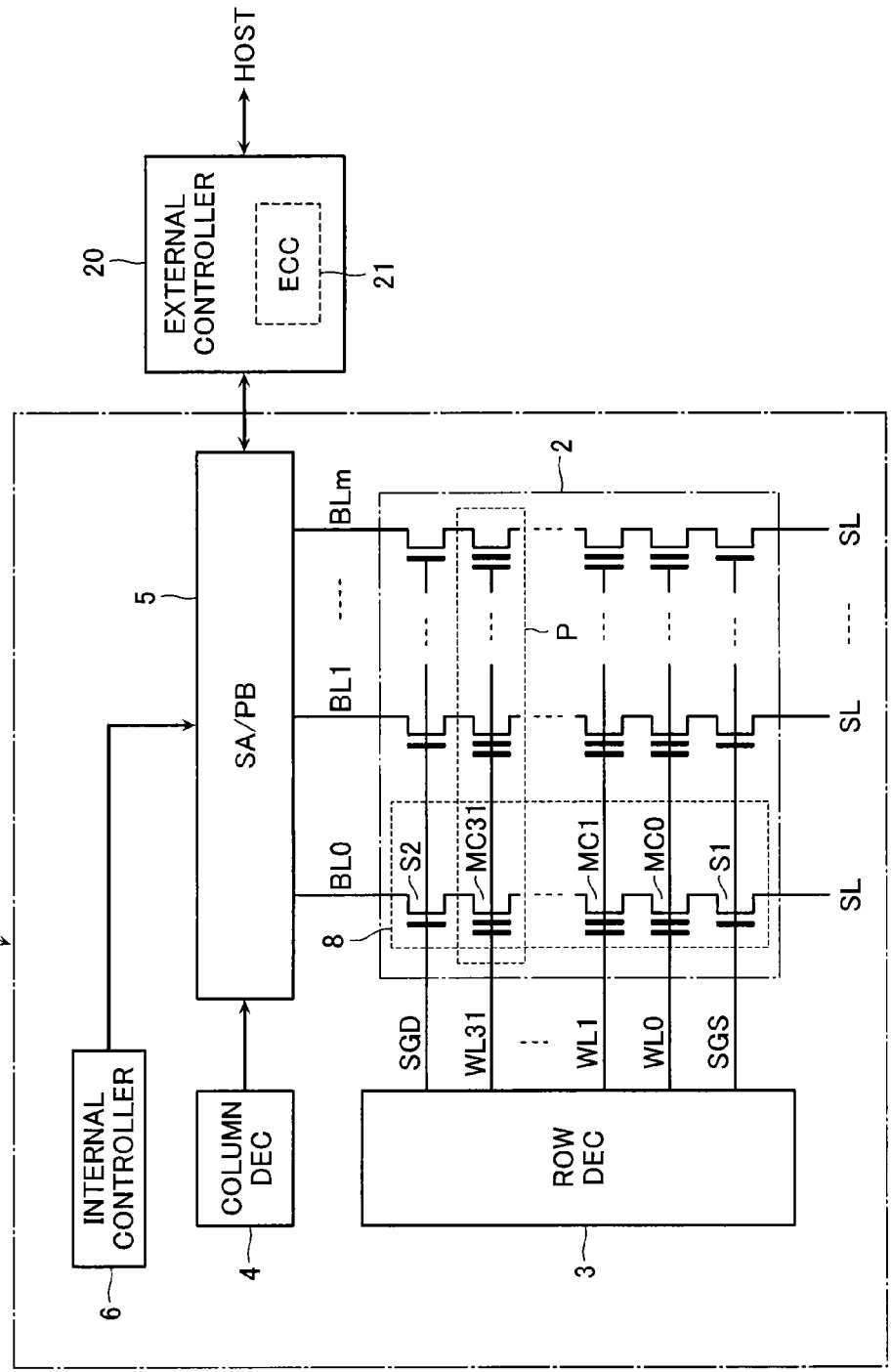
FIG. 1 is a block diagram illustrating a configuration of a memory device according to a first embodiment.

FIG. 1 is a block diagram illustrating a configuration of a memory device according to a first embodiment. The memory device includes a NAND chip 10 and an external controller 20 that controls the NAND chip 10.

The NAND chip 10 includes a memory cell array 2 including a plurality of memory cells MC; a row decoder 3 and a column decoder 4 which select any of the memory cells MC based on an address; a sense amplifier/page buffer 5 which senses and holds data read from the memory cell array 2 and holds data to be written into the memory cell array 2; and an internal controller 6 that controls these components.

Each memory cell MC is composed of a transistor having a laminated gate structure including an electric charge accumulation layer, such as a floating gate, and controls the electric charge accumulated in the electric charge accumulation layer, thereby storing data of four values (2 bits) or more in a nonvolatile manner. A plurality of memory cells MC is NAND-connected so as to share a source and a drain, thereby forming a memory string. Selection gate transistors S1 and S2 are connected to both ends of this memory string, thereby forming a NAND cell unit 8. An end of the NAND cell unit 8 on the side of the selection gate transistor S1 is connected to a source line SL, and another end of the NAND cell unit 8 on the side of the selection gate transistor S2 is connected to a bit line BL. Although the NAND cell unit 8 is formed of 32 memory cells MC0 to MC31 in this embodiment, the number of memory cells MC is not limited to 32 but may be 8, 16, 64, 128, 256, or the like. The control gates of the memory cells MC and the gates of the selection gate transistors S1 and S2 neighboring in the direction orthogonal to the bit lines BL are commonly connected to word lines WL and selection gate lines SGS and SGD respectively orthogonal to the bit lines BL. The memory cells MC commonly connected to the single word line WL constitute page data P which is simultaneously programmed and read.

The external controller 20 programs data into the NAND chip 10 and reads data from the NAND chip 10. The external controller 20 includes an ECC (Error Correction Code) unit 21 that performs error connection encoding on data to be written into the NAND chip 10, and performs error correction decoding on data read from the NAND chip 10.

Figure 2:
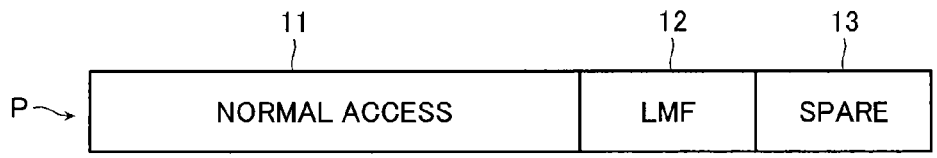
FIG. 2 is a diagram illustrating a configuration of page data of a memory cell array in the memory device.

FIG. 2 illustrates a configuration of the page data P of the memory cell array 2. The page data P includes a normal access area 11 accessible from the external controller 20, an LM flag area 12 for storing an LM flag set when the upper page data P is written into an upper page, and a spare area 13 which is formed of a redundant cell to be replaced with a memory cell MC in which errors occur in the normal access area 11 and the LM flag area 12.

Figure 3:
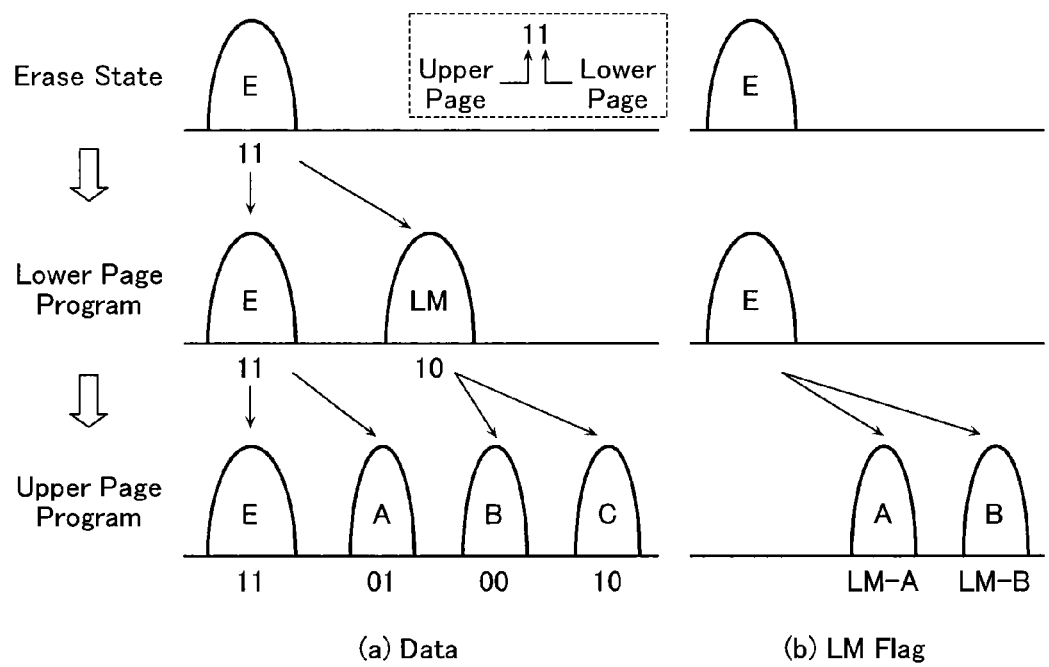
FIG. 3 is a diagram illustrating a threshold value distribution of data of the memory device and LM flags in each program step.

Referring next to FIG. 3, a description is given of the relation between a write operation for each memory cell MC when the data to be programmed into the memory cell MC is quaternary (2-bit) data and a threshold value distribution of the data and LM flags. Note that in 2-bit data represented by "11", "01" or the like in the figure, the value on the left side indicates upper page data, and the value on the right side indicates lower page data.

First, when a memory cell MC is in an erase state, the memory cell MC storing data and the memory cell MC storing the LM flag are in a state in which the electric charge of the electric charge accumulation layer is discharged. Accordingly, the threshold indicates a lowest level, i.e., an E level. When a lower page program is executed, the threshold value of the written memory cell MC in which the lower page data indicates "0" is raised to an LM level from the E level. Further, when an upper page program is executed, the threshold value of the written memory cell MC in which the lower page data indicates "1" and the upper page data indicates "0" is raised to an A level from the E level, and the threshold value of the written memory cell MC in which the lower page data indicates "0" and the upper page data indicates "0" and "1" is raised from the LM level to a B level and a C level, respectively. Here, E level<A level<B level<C level holds. The LM level is distributed in a range of levels higher than a lower limit of the A level and lower than an upper limit of the B level. This is because the amount of threshold value shift is suppressed in the upper page program and a variation in the threshold value due to coupling of neighboring memory cells MC is reduced. When the upper page program is executed, an LM-A flag indicating the A level and an LM-B flag indicating the B level are respectively set to the memory cells MC of the LM flag area 12 so as to determine whether the upper page program is complete in the NAND chip 10. In consideration of the influence of disturb, the LM-A flag and the LM-B flag may be stored as multiple-bit data and provided for majority determination. In this embodiment, each of the LM-A flag and the LM-B flag is stored using six memory cells MC respectively.

Figure 4:
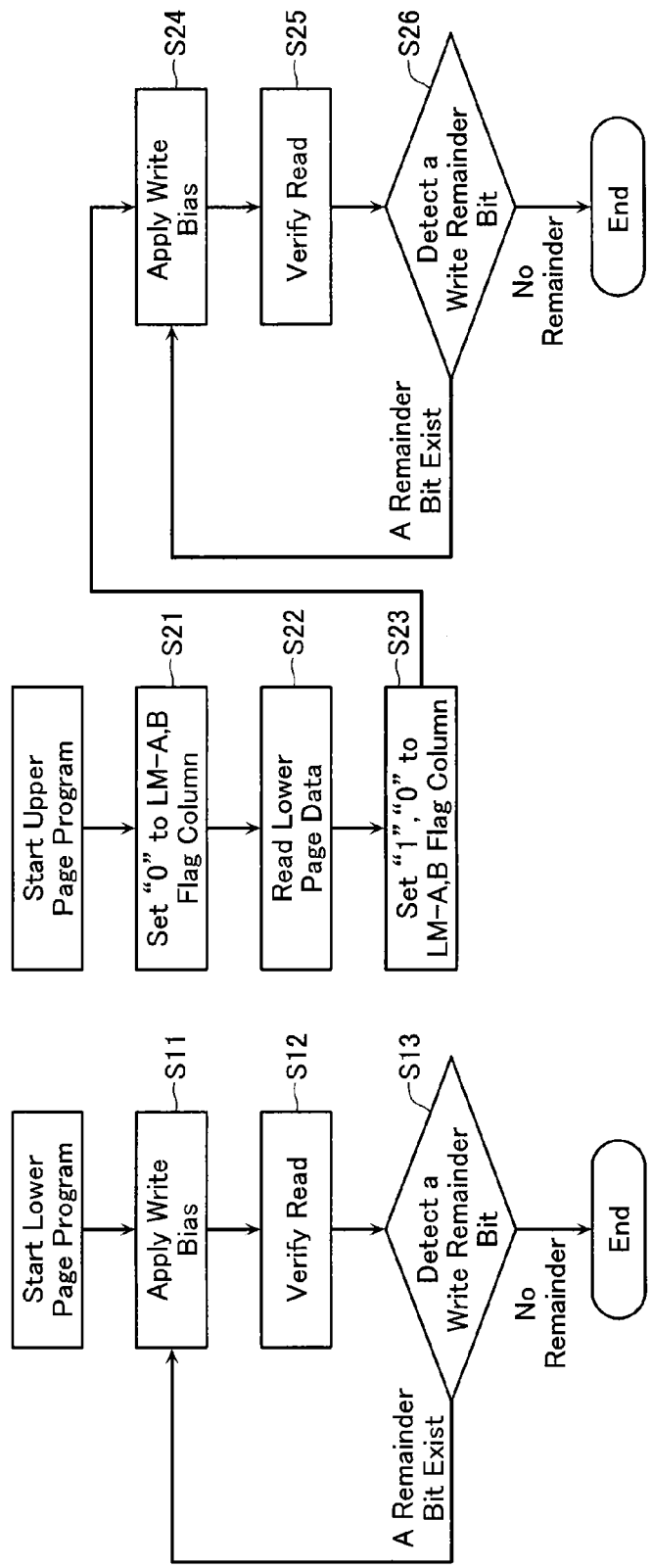
FIG. 4A is a flowchart illustrating a lower page program operation of the memory device.
FIG. 4B is a flowchart illustrating an upper page program operation of the memory device.

Referring next to FIGS. 4A and 4B, a page program operation within the NAND chip 10 will be described. FIG. 4A is a flowchart illustrating a lower page program operation executed by the internal controller 6. When the lower page program is started, write bias is first applied to a selected word line WL (S11). As a result, electrons are accumulated in the electric charge accumulation layer of a selected memory cell MC which is connected to the selected word line WL and the bit line BL set to 0 V, so that the threshold value voltage rises. Next, a verify read operation is executed to confirm whether the threshold value of the selected memory cell MC reaches the LM level (S12). Bits (memory cells MC) having a threshold voltage reached the LM level are set to a pass state by the sense amplifier/page buffer circuit 5. The internal controller 6 detects any write remainder bit by referring to the sense amplifier/page buffer circuit 5 (S13). When there is a remainder bit, the operation of applying write bias is repeated (S11). When there is no remainder bit, the lower page program is ended.

FIG. 4B is a flowchart illustrating an upper page program operation executed by the internal controller 6. The upper page program differs from the lower page program in that prior to writing of the upper page data, the memory cell MC of the LM flag area 12 is set. Specifically, when the upper page program is started, "0" is first set to the column of each of the LM-A flag and the LM-B flag (S21). Next, the lower page data is read (S22), and "1" and "0" are respectively set to the column of the LM-A flag and the column of the LM-B flag (S23). As a result, "01" data (corresponding to the A level in FIG. 3) is set to the LM-A flag column, and "00" data (corresponding to the B level in FIG. 3) is set to the LM-B flag column. After that, write bias is applied to the selected word line WL (S24). As a result, electrons are accumulated in the electric charge accumulation layer of the selected memory cell MC which is connected to the selected word line WL and the bit line BL set to 0 V, so that the threshold value voltage rises. At this time, in the LM flag area 12, the threshold value of the memory cell MC also rises to the A level or the B level. Next, the verify read operation is executed to respectively confirm whether the threshold value of the selected memory cell MC has reached the A, B and C levels (S25). The bits (memory cells MC) having a threshold voltage reached the A, B and C level are each set to the pass state by the sense amplifier/page buffer circuit 5. The internal controller 6 detects any write remainder bit by referring to the sense amplifier/page buffer circuit 5 (S26). When there is a remainder bit, the operation of applying write bias is repeated (S24). When there is no remainder bit, the upper page program is ended.

Note that in the above-mentioned lower page program operation or upper page program operation, when the number of the write remainder bits is equal to or smaller than a predetermined reference value, the lower page program or upper page program may be ended.

Figure 5:
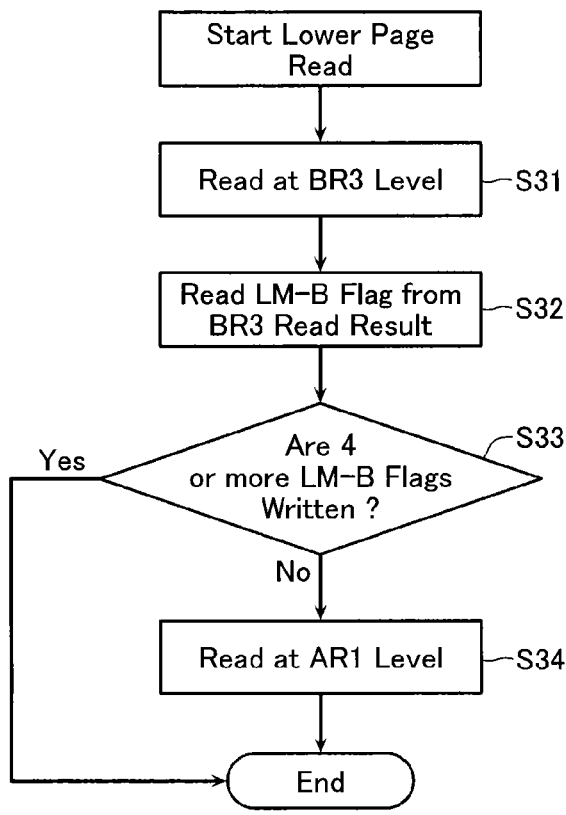
FIG. 5 is a flowchart illustrating a lower page read operation of the memory device.
Figure 6:
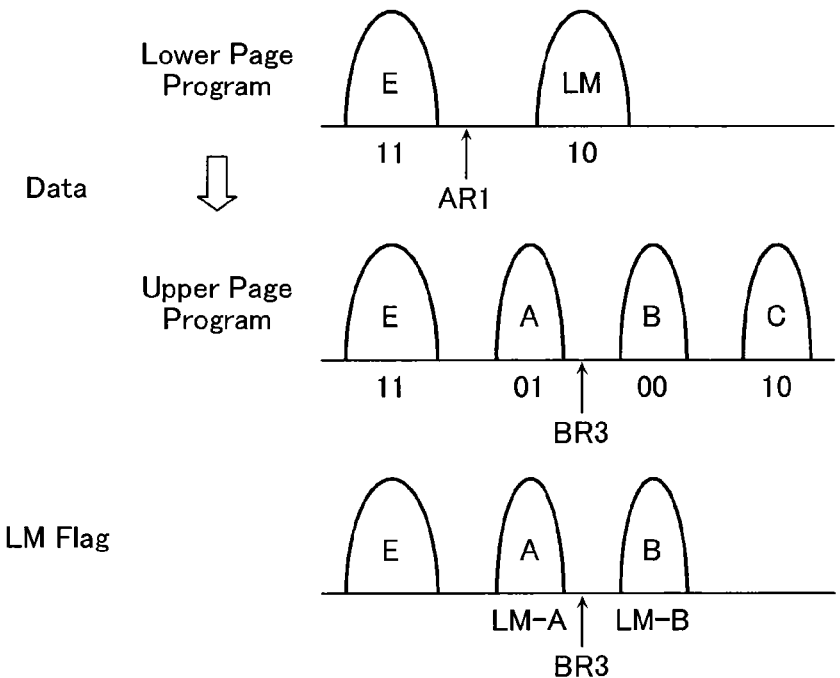
FIG. 6 is a diagram illustrating read levels for use in the lower page read operation of the memory device.

Referring next to FIGS. 5 and 6, an operation for reading lower page data will be described. FIG. 5 is a flowchart of the lower page read operation executed by the internal controller 6. When the lower page reading is started, a read operation at a BR3 level as the read level is first executed (S31). Here, as illustrated in FIG. 6, the BR3 level is set between the A level and the B level of the threshold value voltage distribution after the upper page program. This BR3 level is a level that enables identification of the lower page data for the memory cells MC programmed into the upper page. However, the memory cell MC which is not programmed only into the lower page has an intermediate level in the LM level distribution, which makes it difficult to correctly read the lower page data. Therefore, the LM-B flag is then read from the read result at the BR3 level (S32). As illustrated in FIG. 6, the LM-B flag can be discriminated by utilizing the read result at the BR3 level. If four or more bits of the LM-B flag 4 are already written, that is, if the majority of the six bits is in the set state, it can be assumed that the upper page has already been programmed. Accordingly, it is determined that the read result is a correct read result, and the processing is ended (S33). On the other hand, when four or more bits of the LM-B flag are not written yet, it is determined that the upper page program has not been executed yet (S33), and the operation for reading at an AR1 level is executed (S34). Here, as illustrated in FIG. 6, the AR1 level is set to an intermediate read level between the E level and the LM level. Thus, when the read memory cell MC has finished only the lower page program, correct data is read.

Figure 7:
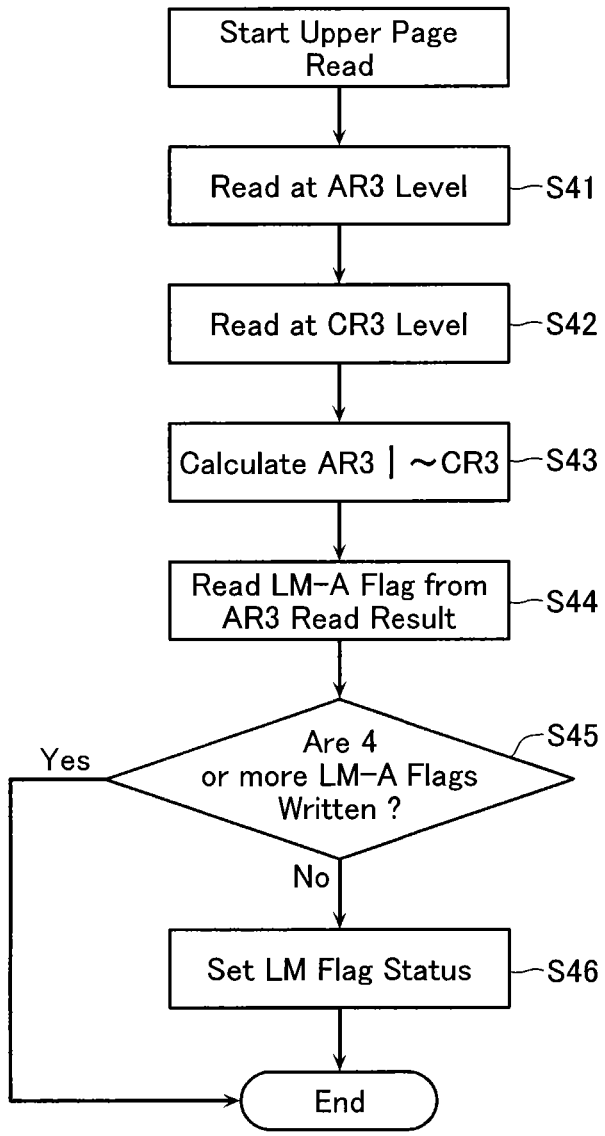
FIG. 7 is a flowchart illustrating an upper page read operation of the memory device.
Figure 8:
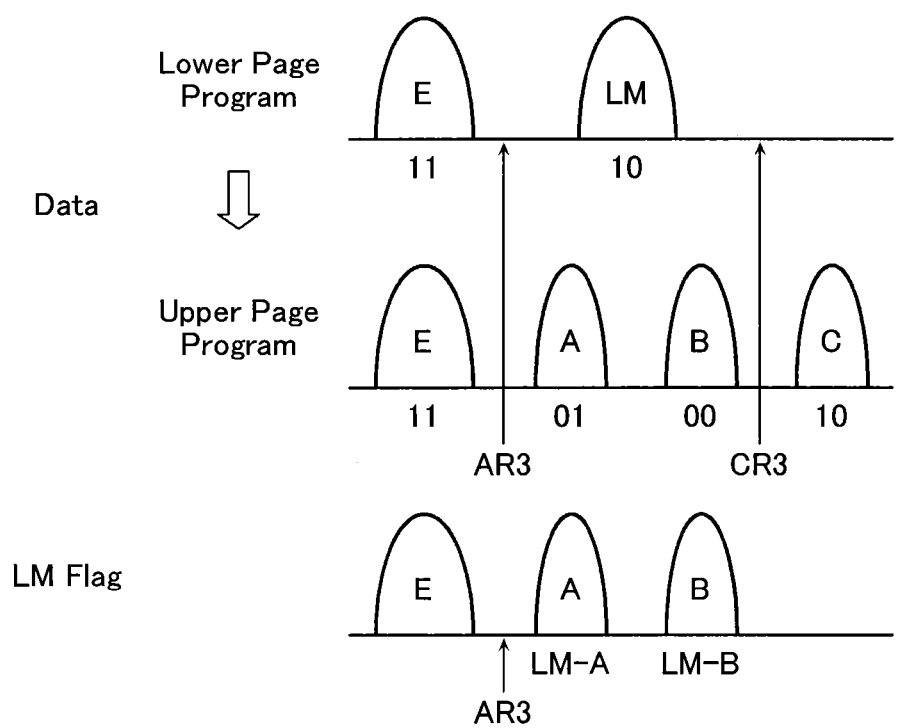
FIG. 8 is a diagram illustrating read levels for use in the upper page read operation of the memory device.

Referring next to FIGS. 7 and 8, the upper page read operation will be described. FIG. 7 is a flowchart illustrating the upper page read operation executed by the internal controller 6. When the upper page read operation is started, reading at the AR3 level as the read level is first executed (S41). Here, as illustrated in FIG. 8, the AR3 level is set between the E level and the A level of the threshold value voltage distribution after the upper page program. Next, reading at the CR3 level as the read level is executed (S42). Here, as illustrated in FIG. 8, the CR3 level is set between the B level and the C level in the threshold value voltage distribution after the upper page program. Then, a logical OR operation is performed on the read result at the AR3 level and negative of the read result at the CR3 level, thereby obtaining higher-order bit data (S43). Next, the LM-A flag is read from the read result at the AR3 level (S44). As illustrated in FIG. 8, the use of the read result at the AR3 level enables discrimination of the LM-A flag. If four or more bits of the LM-A flag are already written, that is, if the majority of the six bits is in the set state, it can be assumed that the upper page has already been programmed. Accordingly, it is determined that the read result is a correct read result, and the processing is ended (S45). On the other hand, when four or more bits of the LM-A flag are not written yet, it is determined that the upper page program has not been executed yet (S45), and the LM flag status is set to the set state to finish the operation (S46).

In the conventional configuration, the step of setting the LM flag status to the set state (S46) is not carried out. When it is determined that four or more bits of the LM-A flag are not written yet, the internal controller 6 sets all higher-order bit data to FFh ("h" indicates a hexadecimal number) and outputs the data from the NAND chip 10. Accordingly, if the LM-A flag is erroneously determined when an acquired local failure occurs in the LM flag area 12 or a forcible interruption during writing occurs, for example, even though the upper page program is ended, the upper page data is unconditionally replaced with FFh and the external controller 20 erroneously determines that no data is written in the upper page. As a result, the external controller 20 has such a defect that the external controller returns data as normal data each indicating FFh to a host device even when a read error occurs.

In this regard, according to this embodiment, the determination result of the LM-A flag is merely reflected in the LM flag status, and the data of the upper page is not replaced with FFh. The LM status is not included in the data from the NAND chip 10 but is a kind of status information that is directly output from the internal controller 6 to the external controller 20. Accordingly, the external controller 20 can determine whether the data read from the NAND chip 10 is programmed into the upper page based on the LM flag status and the content of the upper page data.

In this embodiment, even in the case of reading the memory cell MC for which only the lower page program is complete as illustrated in FIG. 8, each of the AR3 level and the CR3 level has reached the level at which the lower page data and the upper page data can be read correctly. Thus, the external controller 20 can determine whether the program of the upper page has not been finished yet, only when the error correction of the data read from the NAND chip 10 is possible and the LM flag status is set.

Figure 9:
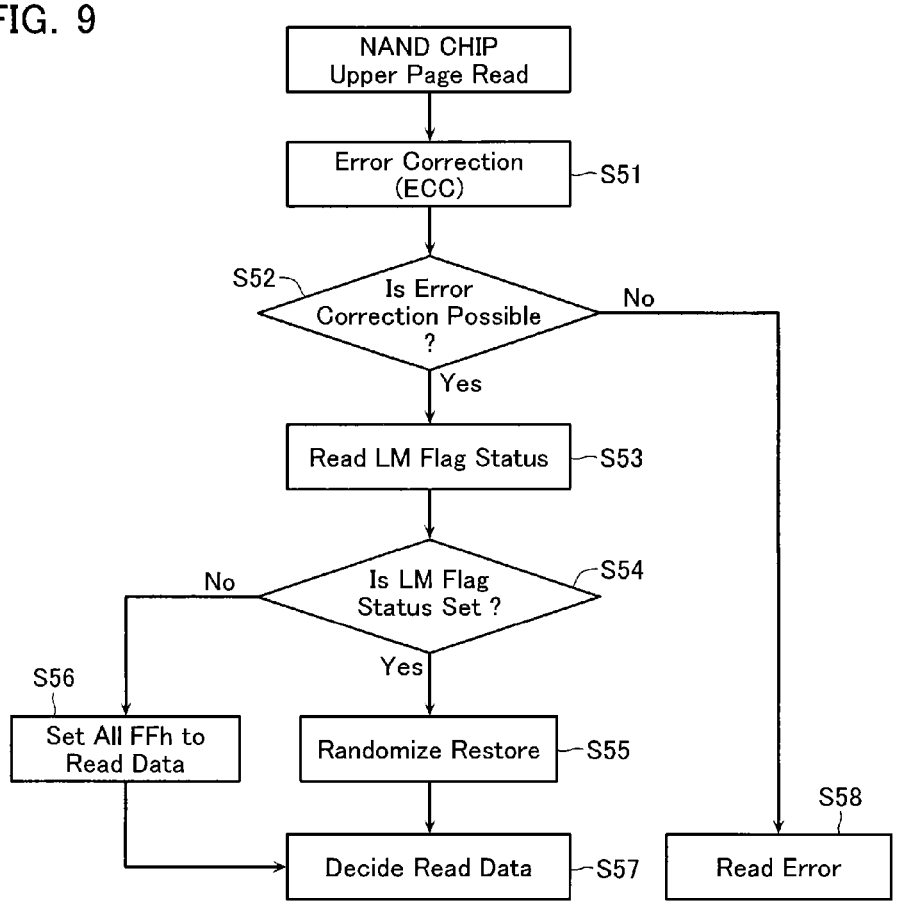
FIG. 9 is a flowchart illustrating operation of an external controller in the upper page read operation of the memory device.

FIG. 9 is a flowchart illustrating the upper page read operation of the external controller 20. First, the error correction processing is executed on the upper page data read from the NAND chip 10 (S51). If the error correction is impossible (S52), a read error is detected and the processing is ended (S58). On the other hand, if the error correction is possible (S52), the LM flag status is read (S53). Next, when the LM flag status is checked (S54) and the LM flag status has not been set, all the read data is set to FFh (S56) and the read data is determined (S57). When the LM flag status has been set, randomize restore processing is performed on the read upper page data (S55) and the read data is determined (S57).

Execution of such processing prevents the external controller 20 from erroneously recognizing the state in which the upper page is not written, that is, the state in which all the data is set to FFh, even when an error occurs in at least the read upper page data. Normally, when the LM flag is in the error state, the read data can also contain an error, and thus the addition of such a determination process is extremely useful.

Second Embodiment

In the first embodiment, the LM flag status is output as one status information from the NAND chip 10 and the state of the LM flag status is determined in the external controller 20. On the other hand, in a second embodiment, an upper page flag bit indicating whether the upper page program has been finished or not is added to a part of the data to be written into the NAND chip 10 from the external controller 20.

Figure 10:
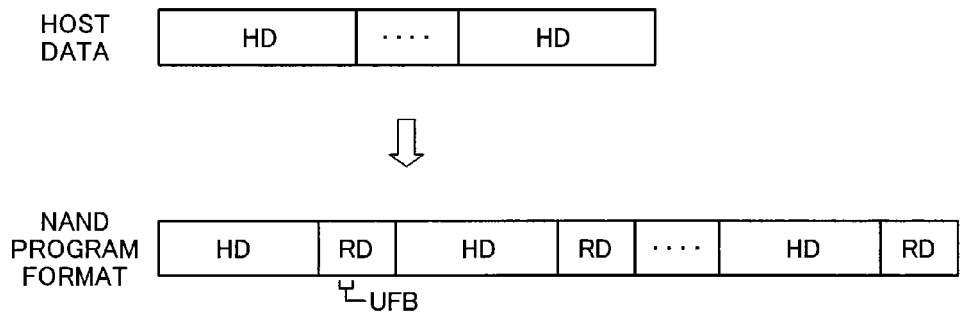
FIG. 10 is a diagram illustrating a program data format for a NAND chip of a memory device according to a second embodiment.

FIG. 10 illustrates host data to be transmitted from the host device and a program format to be written into the NAND chip 10. Host data HD forms one block for each page. A redundant unit RD is added to the host data HD of each page in the program format to be written into the NAND chip 10. The redundant unit RD records management information of the external controller 20, parity data of the ECC, and the like. The management information includes an upper page flag bit UFB having one bit length, for example. When writing the host data HD of the upper page into the NAND chip 10, the external controller 20 sets the upper page flag bit UFB to "1".

Figure 11:
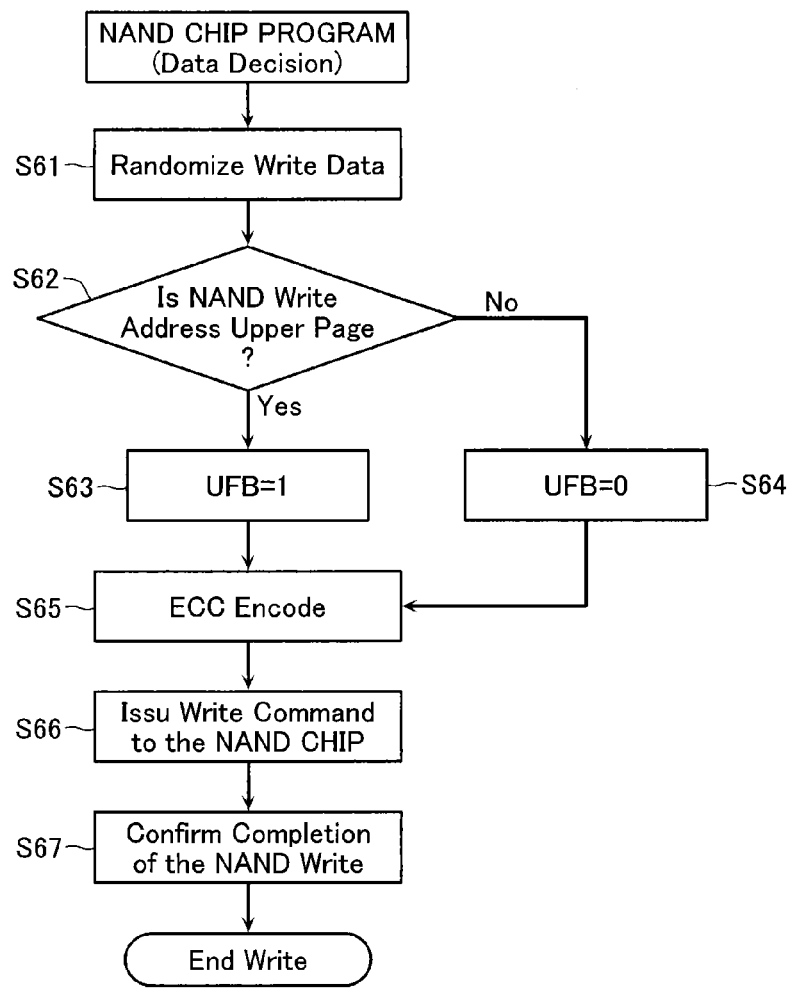
FIG. 11 is a flowchart illustrating a NAND chip program operation of the memory device.

FIG. 11 is a flowchart illustrating write processing to the NAND chip 10 by the external controller 20. First, the determined written data is randomized (S61). Next, it is checked whether the write address of the NAND chip 10 indicates the upper page (S62). If the write address indicates the upper page, the upper page flag bit UFB is set to "1" (S63). If the write address indicates the lower page, the upper page flag bit UFB is maintained at "0" (S64). Next, the ECC unit 21 performs ECC encoding on the written data (S65), and a write instruction is issued to the NAND chip 10 (S66). Lastly, it is confirmed whether writing to the NAND chip 10 has been finished (S67) and the write operation is ended.

In the NAND chip 10, the upper page flag bit UFB is written into the normal access area 11 as apart of data, unlike the LM flag to be stored in the LM flag area 12 illustrated in FIG. 2. Accordingly, this upper page flag bit UFB is subjected to ECC processing, like other data. Therefore, there is no need to provide a multiple-bit structure like the LM flag, and the use of one bit is sufficient to ensure the reliability.

The program processed by the NAND chip 10 may be same as the processing illustrated in FIGS. 4A and 4B. The processing for reading the lower-order data in the NAND chip 10 may also be same as the processing illustrated in FIG. 5. In this embodiment, the LM flag status is not used, so the upper page read processing is different from that of the above-described embodiment.

Figure 12:
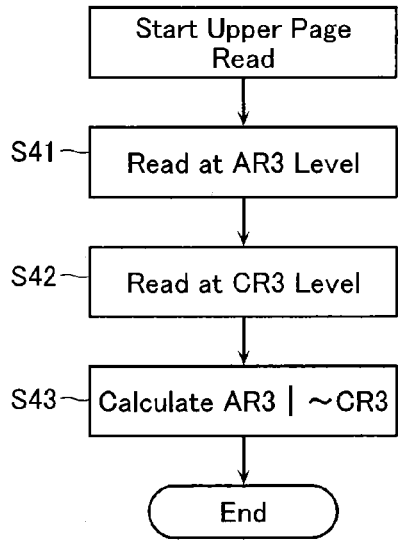
FIG. 12 is a flowchart illustrating an upper page read operation of the memory device.

FIG. 12 is a flowchart illustrating an upper page read operation of the internal controller 6. Here, the read operation at the AR3 level (S41), the read operation at the CR3 level (S42), and the calculation of a logical OR operation between the data read at the AR3 level and the logical negation of the data read at the CR3 level to obtain the upper page data (S43) are similar to those of the processing illustrated in FIG. 7. The subsequent flag read processing is not carried out.

Figure 13:
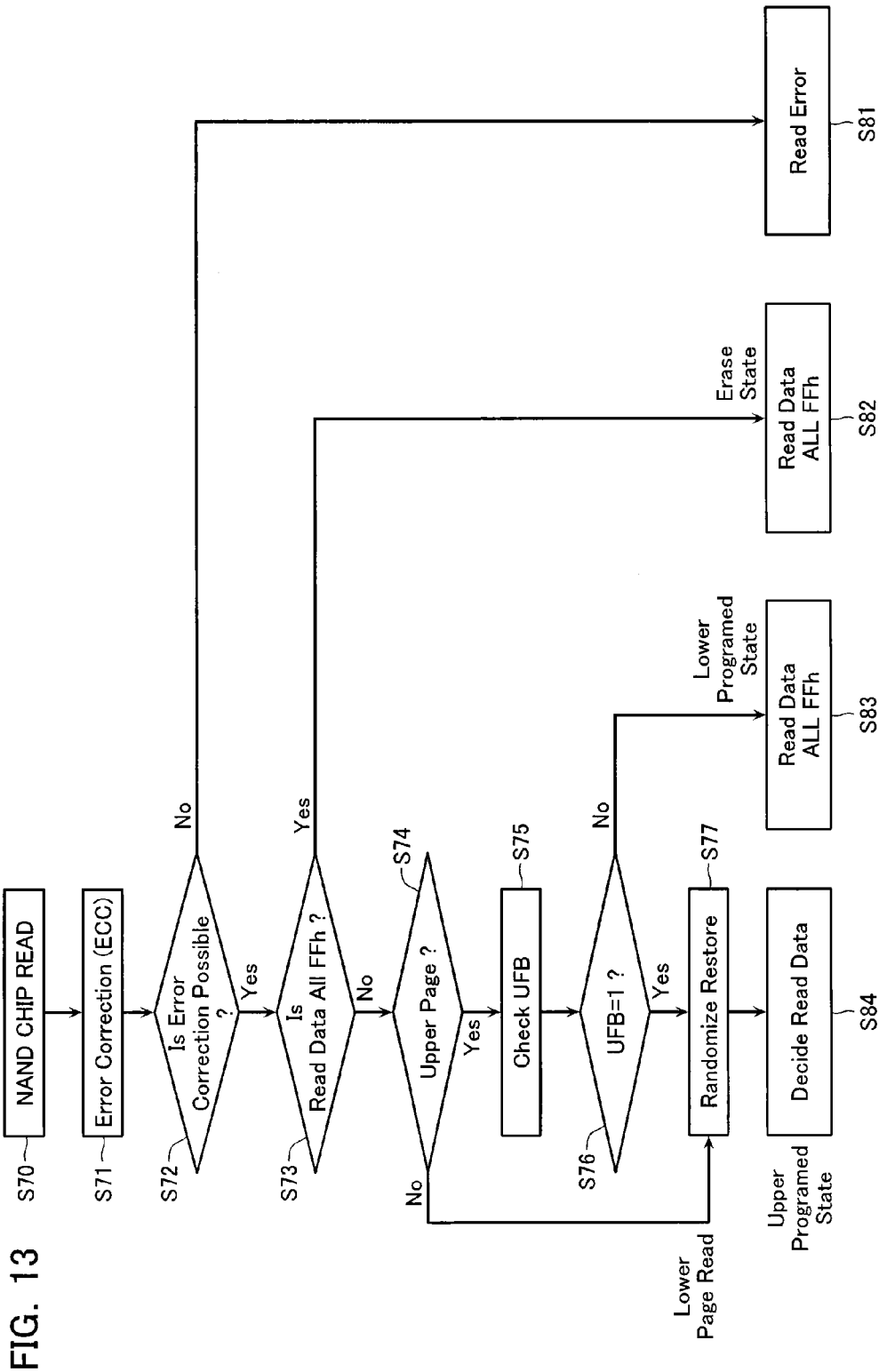
FIG. 13 is a flowchart illustrating a NAND chip read operation of the memory device.

Next, the read operation of the NAND chip 10 which is executed by the external controller 20 will be described with reference to the flowchart of FIG. 13.

Data is first read from the NAND chip 10 (S70). Next, the ECC unit 21 executes the error correction processing (S71). Here, when the error correction is impossible (S72), a read error is detected and the processing is ended (S81). When the error correction is possible, it is checked whether all the read data indicate FFh (S73). When all the read data indicate FFh, the erase state is detected and all the read data are determined as FFh (S82). When not all the read data indicate FFh, one of the state in which the upper page is written or the state in which the lower page is written is determined (S74). The determination as to whether the state in which the upper page is written or the state in which only the lower page is written is performed using the LM flag within the NAND chip 10. In the case of upper page reading, the upper page flag bit UFB is checked (S75). When the upper page flag bit UFB does not indicate "1", the lower page write state is detected and all the read data are determined as FFh (S83). When the upper page flag bit UFB indicates "1", the upper page write state is detected and the randomize restore is executed (S77) and the read data is determined (S84). In the lower page read operation, the randomize restore operation is executed (S77) without determining the upper page flag bit UFB (S75 and S76), and the read data is decided (S84).

According to the second embodiment, the upper page flag bit indicating that the upper page program has been finished is subjected to ECC processing together with the data, and thus the reliability is high. Further, the presence or absence of the end of the upper page program can be determined by the external controller 20. Therefore, there is no possibility that a failure such as overwriting of data with the upper page occurs, in spite of the upper page program being completed.

Third Embodiment

Figure 14:
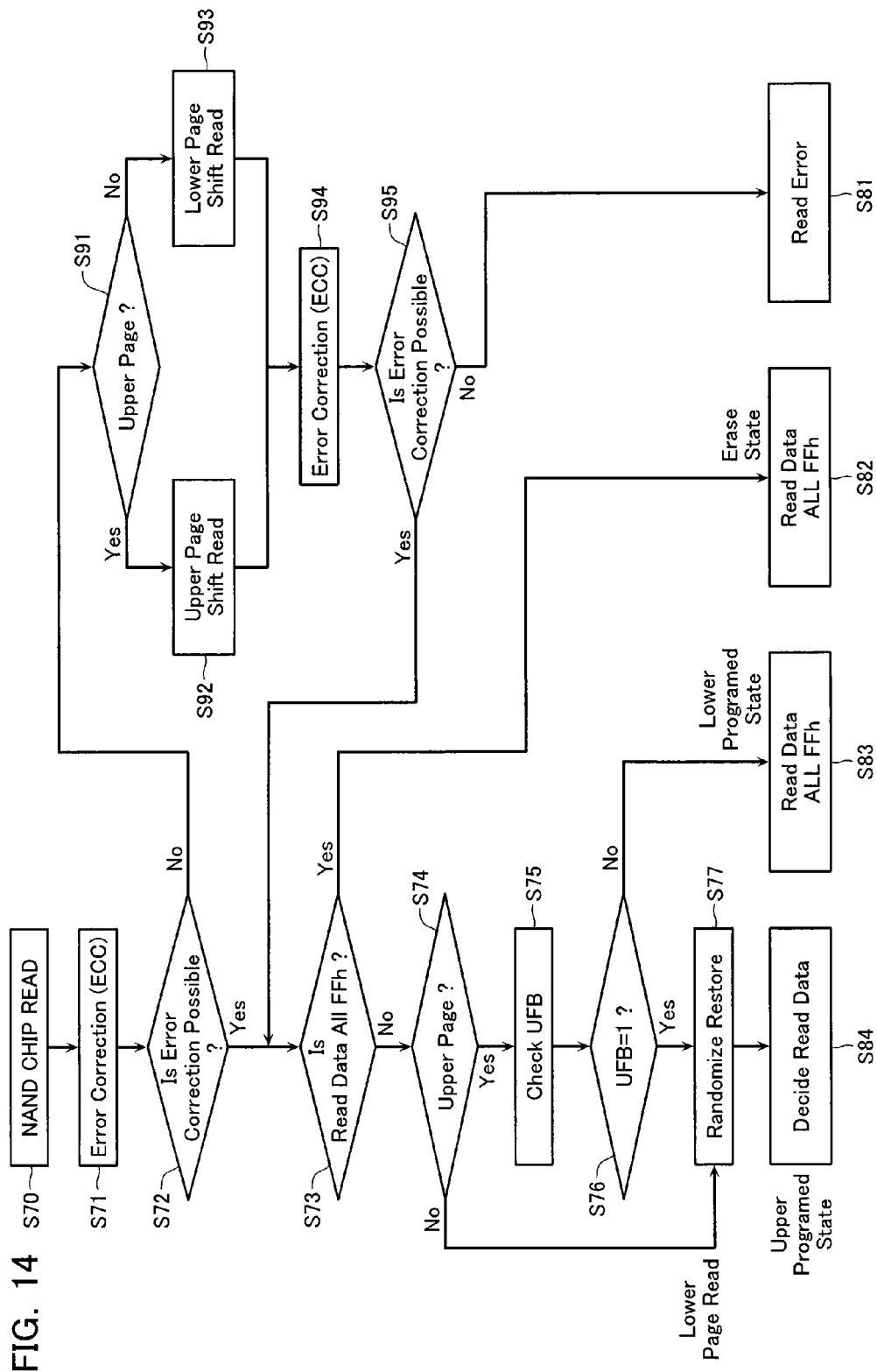
FIG. 14 is a flowchart illustrating a NAND chip read operation of a memory device according to a third embodiment.

FIG. 14 is a flowchart illustrating the read operation of the NAND chip 10 which is executed by the external controller 20 of a memory device according to a third embodiment. Note that in FIG. 14, the same processes as that illustrated in FIG. 13 are denoted by the same reference symbols, and a detailed description thereof is omitted.

The third embodiment differs from the second embodiment in that there is additional process to be carried out in a case where the error correction cannot be performed upon error correction.

That is, the NAND-type flash memory has a feature that an optimum read level shifts with a lapse of time. Even when the error correction is impossible, data can be normally read by shifting the read level in some cases. Therefore, in this embodiment, if the error correction cannot be carried out as a result of performing the error correction on the data read from the NAND chip 10, when the data is upper page data (S91), an upper page shift read operation is executed (S92), and when the data is lower page data (S91), a lower page shift read operation is executed (S93). The upper page shift read operation and the lower page shift read operation can be carried out as the read processing by shifting the reading levels of AR3 level and CR3 level. Then, the error correction processing is executed again (S94), and if the error correction is possible (S95), the process is returned to normal processing (and step S73 and subsequent steps). In the other case, a read error is detected (S81).

The addition of such processes improves the reliability of the memory device. Note that in FIG. 14, only one shift read operation is illustrated. However, the shift read operation may be executed multiple times by changing the read level in multiple levels.

Fourth Embodiment

Figure 15A:
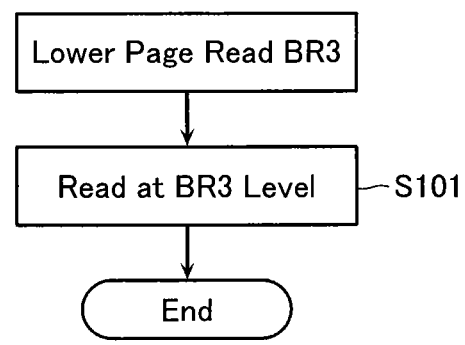
FIG. 15A is a flowchart illustrating a lower page read operation based on a level BR3 of a memory device according to a fourth embodiment.
Figure 15B:
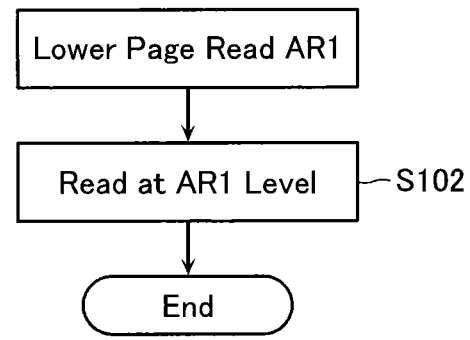
FIG. 15B is a flowchart illustrating a lower page read operation based on a level AR1 of the memory device.
Figure 16:
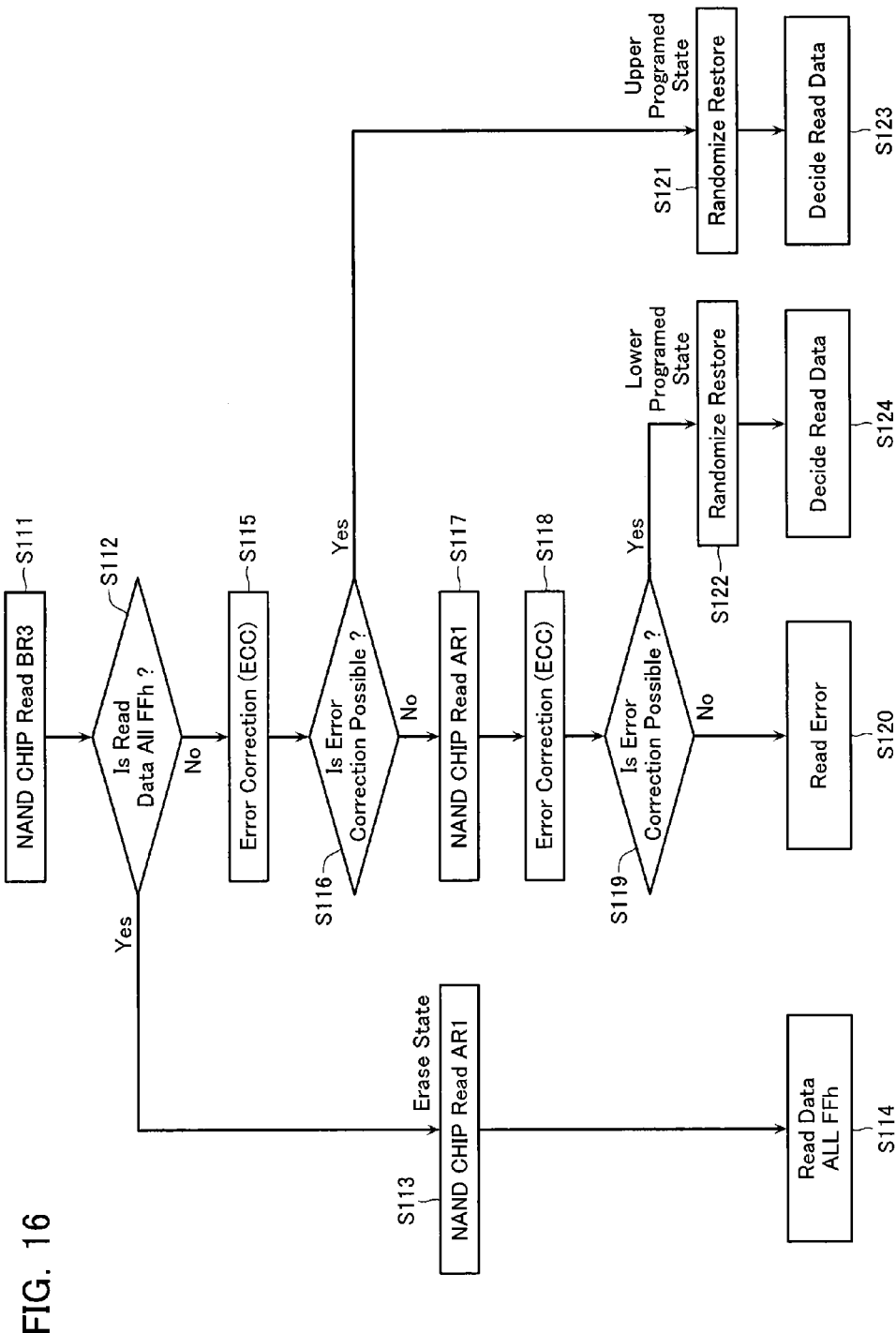
FIG. 16 is a flowchart illustrating the NAND chip read operation of the memory device.

FIGS. 15A and 15B are flowcharts each illustrating the lower page read operation of the internal controller 6 of a memory device according to a fourth embodiment. FIG. 16 is also a flowchart illustrating the read operation of the NAND chip 10 which is executed by the external controller 20.

In the above embodiments, the LM flag status or the upper page flag bit is used. However, in this embodiment, the determination as to whether the upper page has been programmed is made without using the status or the flag.

First, the internal controller 6 prepares two commands as the lower page read commands to be executed. One of them corresponds to the lower page read BR3 illustrated in FIG. 15A, and the other corresponds to the lower page read AR1 illustrated in FIG. 15B. As illustrated in FIG. 15A, in the lower page read BR3, the read operation at the BR3 level as the read level is executed. As illustrated in FIG. 15B, in the lower page read AR1, the read operation at the AR1 level as the read level is executed.

As illustrated in FIG. 16, the external controller 20 first issues a lower page read BR3 command to the NAND chip 10 (S111). Then, when all read data indicate FFh (S112), the external controller 20 determines that the read page is in the erase state and reissues a lower page read AR1 command (S113) and determines all read data as FFh (S114). When all read data do not indicate FFh, the error correction processing is executed (S115), and when error correction is possible (S116), it is determined that the read page is in the upper page program state, and the randomize restore is executed (S121) and the read data is determined (S123). On the other hand, when the error correction is impossible (S116), there is a possibility that the upper page has not been programmed yet. Accordingly, the lower page read AR1 command is issued to the NAND chip 10 (S117) and the error correction is executed again (S118). As a result, when the error correction is possible (S119), it is determined that the read page is in the lower page program state, and the randomize restore is executed (S122) and the read data is determined (S124). Even in a case where the error correction is repeated, if the error correction cannot be carried out (S119), a read error is detected (S120).

According to this embodiment, there is no need to use information such as the LM flag status nor the upper page flag bit which indicate whether the upper page program has been finished. This eliminates the need for the LM flag area 12 in the NAND chip 10, thereby making it possible to increase the storage area usable by a user.

Fifth Embodiment

Figure 17:
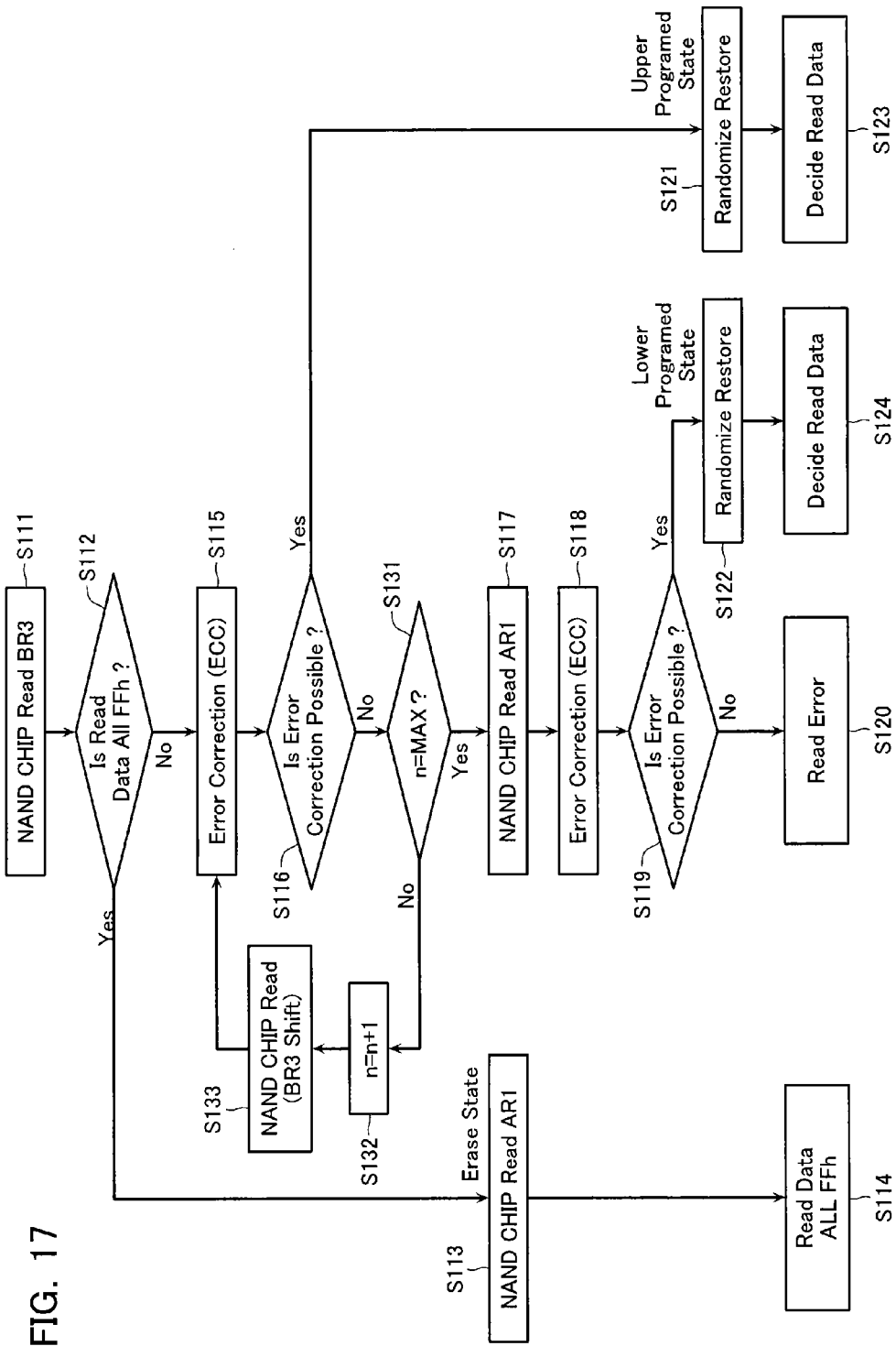
FIG. 17 is a flowchart illustrating a NAND chip read operation of a memory device according to a fifth embodiment.

FIG. 17 is a flowchart illustrating the read operation of the NAND chip 10 which is executed by the external controller 20 of a memory device according to a fifth embodiment. Note that in FIG. 17, the same processes as that illustrated in FIG. 16 are denoted by the same reference symbols, and a repeated description thereof is omitted.

In this embodiment, the shift read operation which is carried out upon error correction described in the third embodiment is added to the read operation illustrated in FIG. 16. Specifically, after the first error correction processing (S112), when the error correction is impossible (No in S116), the BR3 level is shifted to execute the lower page read BR3 for the NAND chip 10 (S133). This processing is repeated "n" times until "n" reaches MAX (S131, S132). As a result, when the error correction is enabled, it is determined that the upper page is in the programmed state, and randomize restore is carried out (S121).

Note that the step of randomizing the written data illustrated in FIG. 11 (S61) can be carried out at the subsequent stage of setting of the upper page flag bit UFB (S63, S64), for example, including the upper page flag bit UFB. In this case, the randomize restore processing (S77) illustrated in FIG. 13 is executed at the subsequent stage of the error correction processing (S71). In FIGS. 11, 13, 14, 16, and 17, the randomize processing and the randomize restore processing are not necessarily carried out, but can be omitted.

Other Embodiments

The above embodiments have described, by way of example, a NAND flash memory as a memory device. However, the present invention can be applied not only to the NAND flash memory, but also to memory devices of other forms, such as an NOR-type flash memory and a ReRAM, which can store data of two or more bits in one memory cell, as a matter of course.

Other

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device, comprising:
a memory chip that stores data; and
an external controller that controls the memory chip,
the memory chip comprising:
a memory cell array including a plurality of memory cells configured to store data of two or more bits, the memory cells constituting a page as a program unit; and
an internal controller that executes a program operation for page data including a lower page program operation and an upper page program operation for the same page of the memory cell array, and executes a read operation for page data including a lower page read operation and an upper page read operation from the memory cell array,
the internal controller being configured to output the read page data from the memory cell array to the external controller, regardless of whether the upper page program operation is complete or not, in the upper page read operation,
the external controller being configured to add, to a part of page data to be programmed, identification information for identifying whether the page data is lower page data or upper page data, in the program operation, and to identify whether the read page data is lower page data or upper page data by referring to the identification information, after performing error correction decoding on data read from the memory chip, in the read operation.

2. The memory device according to claim 1, wherein the external controller performs error correction decoding on the page data read from the memory cell array, and refers to the identification information to determine whether the upper page program operation is complete or not, only when the page data can be corrected.

3. The memory device according to claim 2, wherein the external controller determines all read upper page data as "1" upon determining that the upper page data read from the memory cell array is not programmed.

4. The memory device according to claim 1, wherein
the memory cells store four 2-bit data items respectively corresponding to first, second, third and fourth threshold values, and
the internal controller sets, in the lower page program operation, the memory cells to one of the first threshold value and a fifth threshold value which is greater than a lower limit of the second threshold value and smaller than an upper limit of the third threshold value, sets the memory cells to one of the first to fourth threshold values in the upper page program, executes the lower page read operation by using a second read level between the second threshold value and the third threshold value, and executes the upper page read operation by using a first read level between the first threshold value and the second threshold value and a third read level between the third threshold value and the fourth threshold value.

5. The memory device according to claim 4, wherein
the memory cell array includes a normal access area accessible from the external controller, and an LM flag area for storing an LM flag indicating whether the upper page program operation for each page of the normal access area is complete, and
the internal controller sets the LM flag from the first threshold value to the second threshold value and the third threshold value in the upper page program operation.

6. The memory device according to claim 5, wherein after execution of the lower page read operation using the second read level, the internal controller executes the lower page read operation using a fourth read level between the first threshold value and the fifth threshold value, upon determining that the upper page program operation is not complete by referring to the LM flag.

7. The memory device according to claim 1, wherein
the memory cells are configured to store data of two or more bits by changing a physical state in four steps or more, and
the internal controller changes the physical state of each memory cell stepwise in the upper page program operation and the lower page program operation.

8. The memory device according to claim 7, wherein each of the memory cells includes an electric charge accumulation layer and changes a threshold value as a physical state.

9. A memory device, comprising:
a memory chip that stores data; and
an external controller that controls the memory chip,
the memory chip comprising:
a memory cell array including a plurality of memory cells configured to store data of two or more bits, the memory cells constituting a page as a program unit; and
an internal controller that executes a program operation for page data including a lower page program operation and an upper page program operation for the same page of the memory cell array, and executes a read operation for page data including a lower page read operation and an upper page read operation from the memory cell array,
the memory cell array including a normal access area accessible from the external controller, and an LM flag area for storing an LM flag indicating whether the upper page program operation for each page of the normal access area is complete,
the internal controller being configured to set the LM flag in the upper page program operation, output the page data read from the memory cell array to the external controller, regardless of whether the upper page program operation is complete or not, in the upper page read operation, and output a state of the LM flag corresponding to the read page data to the external controller as status information,
the external controller including an error correction unit that performs error correction encoding on data to be programmed into the memory cell array and performs error correction decoding on data read from the memory cell array, and being configured to identify whether the read page data is lower page data or upper page data by referring to the status information, after performing the error correction decoding on data read from the memory chip, in the read operation.

10. The memory device according to claim 9, wherein the external controller performs error correction decoding on the page data read from the memory cell array, and refers to the status information to determine whether the upper page program operation is complete or not, only when the page data can be corrected.

11. The memory device according to claim 9, wherein the external controller determines all read upper page data as "1" upon determining that the upper page data read from the memory cell array is not programmed.

12. The memory device according to claim 9, wherein
the memory cells store four 2-bit data items respectively corresponding to first, second, third and fourth threshold values, and
the internal controller sets, in the lower page program operation, the memory cells to one of the first threshold value and a fifth threshold value which is greater than a lower limit of the second threshold value and smaller than an upper limit of the third threshold value, sets the memory cells to one of the first to fourth threshold values in the upper page program, executes the lower page read operation by using a second read level between the second threshold value and the third threshold value, and executes the upper page read operation by using a first read level between the first threshold value and the second threshold value and a third read level between the third threshold value and the fourth threshold value.

13. The memory device according to claim 12, wherein the internal controller sets the LM flag from the first threshold value to the second threshold value and the third threshold value in the upper page program operation.

14. The memory device according to claim 13, wherein after execution of the lower page read operation using the second read level, the internal controller executes the lower page read operation using a fourth read level between the first threshold value and the fifth threshold value, upon determining that the upper page program operation is not complete by referring to the LM flag.

15. The memory device according to claim 9, wherein
the memory cells are configured to store data of two or more bits by changing a physical state in four steps or more, and
the internal controller changes the physical state of the memory cells stepwise in the upper page program operation and the lower page program operation.

16. The memory device according to claim 15, wherein each of the memory cells includes an electric charge accumulation layer and changes a threshold value as a physical state.

17. A memory device, comprising:
a memory chip that stores data; and
an external controller that controls the memory chip,
the memory chip comprising:
a memory cell array including a plurality of memory cells configured to store data of two or more bits, the memory cells constituting a page as a program unit; and
an internal controller that executes a program operation for page data including a lower page program operation and an upper page program operation for the same page of the memory cell array, and executes a read operation for page data including a lower page read operation and an upper page read operation from the memory cell array,
the external controller including an error correction unit that performs error correction encoding on data to be programmed into the memory cell array and performs error correction decoding on data read from the memory cell array,
the internal controller being configured to output the read page data from the memory cell array to the external controller, regardless of whether the upper page program operation is complete or not, in the upper page read operation.

18. The memory device according to claim 17, wherein the external controller identifies whether the read page data is lower page data or upper page data based on a result of error correction decoding, after performing the error correction decoding on data read from the memory chip, in the read operation.

19. The memory device according to claim 18, wherein the external controller determines all read upper page data as "1" upon determining that the upper page data read from the memory cell array is not programmed.

20. The memory device according to claim 17, wherein
the memory cells store four 2-bit data items respectively corresponding to first, second, third and fourth threshold values, and
the internal controller sets, in the lower page program operation, the memory cells to one of the first threshold value and a fifth threshold value which is greater than a lower limit of the second threshold value and smaller than an upper limit of the third threshold value, sets the memory cells to one of the first to fourth threshold values in the upper page program, executes the lower page read operation by using a second read level between the second threshold value and the third threshold value, and executes the upper page read operation by using a first read level between the first threshold value and the second threshold value and a third read level between the third threshold value and the fourth threshold value.

\* \* \* \* \*